(12) United States Patent
He et al.

(10) Patent No.: US 7,889,587 B2
(45) Date of Patent: Feb. 15, 2011

(54) FUSE PROGRAMMING SCHEMES FOR ROBUST YIELD

(75) Inventors: Jun He, Portland, OR (US); Zhanping Chen, Portland, OR (US); Jeffrey Hicks, Manning, OR (US); Gregory F. Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 814 days.

(21) Appl. No.: 11/635,125

(22) Filed: Dec. 6, 2006

(65) Prior Publication Data

US 2008/0136496 A1 Jun. 12, 2008

(51) Int. Cl.
    *G11C 17/18* (2006.01)
(52) U.S. Cl. .............................. 365/225.7; 365/189.07; 365/200
(58) Field of Classification Search .............. 365/225.7, 365/189.07, 200
    See application file for complete search history.

(56) References Cited

U.S. PATENT DOCUMENTS

| 6,333,878 | B2 * | 12/2001 | Ooishi | 365/200 |
| 6,469,923 | B1 * | 10/2002 | Hidaka | 365/149 |
| 6,639,848 | B2 * | 10/2003 | Maejima | 365/189.07 |
| 7,307,910 | B2 * | 12/2007 | Nam et al. | 365/225.7 |

* cited by examiner

*Primary Examiner*—Pho M Luu
(74) *Attorney, Agent, or Firm*—Blakely, Sokoloff, Taylor & Zafman LLP (57) ABSTRACT

A program circuit generates first and second currents to program the fuse. The second current is higher than the first current. A control circuit controls generating the first and second currents in succession.

12 Claims, 6 Drawing Sheets

FUSE PROGRAMMING SCHEMES FOR ROBUST YIELD

BACKGROUND

1. Field of the Invention

Embodiments of the invention relate to the field of semiconductor technology, and more specifically, to fuse programming.

2. Description of Related Art

Fuse elements are commonly used in integrated circuits to improve manufacturing yield or customize a circuit. A fuse may be programmed by passing a current with sufficient strength. Fuse programming yield is very sensitive to the transistor strength in the fuse circuit and the resistance value of the fuse element.

Existing techniques for fuse programming have a number of drawbacks. Typically, a single pulse programming is performed. Using single pulse programming, a large process variation in both front end and back end usually results in either under-programming or over-programming from die to die and from wafer to wafer. Under-programming may be caused by a high resistance of the pre-burn fuse element and/or weak transistor. Over-programming may be caused by a low resistance of the pre-burn fuse element and/or strong transistor. Both of the results are undesirable. Under-programming leads to incorrect result because a fuse is not completely blown up. Over-programming may cause collateral damage, leading to low manufacturing yield and reduced reliability.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is a technique to program a fuse. A program circuit generates first and second currents to program the fuse. The second current is higher than the first current. A control circuit controls generating the first and second currents in succession.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process, which is usually depicted as a flowchart, a flow diagram, a structure diagram, or a block diagram. Although a flowchart may describe the operations as a sequential process, many of the operations can be performed in parallel or concurrently. A loop or iterations in a flowchart may be described by a single iteration. It is understood that a loop index or loop indices or counter or counters are maintained to update the associated counters or pointers. In addition, the order of the operations may be re-arranged. A process terminates when its operations are completed. A process may correspond to a method, a program, a procedure, etc. A block diagram may contain blocks or modules that describe an element, an item, a component, a device, a unit, a subunit, a structure, a method, a process, a function, an operation, a functionality, or a task, etc. A functionality or an operation may be performed automatically or manually.

One embodiment of the invention is a technique to program fuses in integrated circuits. The technique provides a novel programming sequence with gradually increasing program voltages or currents to reduce collateral damage, resulting in a robust manufacturing yield. The technique includes a new circuit and testing scheme to enable a multi-segment fuse programming scheme to successfully program all the fuses in an integrated circuit under a large process variation. The technique prevents collateral damage caused by over programming that may lead to melting of the fuse and logic circuit associated with the fuse bank.

A fuse may be a metal fuse, a poly-silicon fuse, or any other type of electrically programmable fuse. It may have a pre-burn resistance which is the resistance before the programming. Due to process variations, fuses in an integrated circuits may have pre-burn resistances in a range of values (e.g., from $20\Omega$ to $100\Omega$). After programming, the post-burn resistance may become quite large (e.g., from $40$ K$\Omega$ to $100$ K$\Omega$), corresponding to an open circuit. A program region covering a region of pre-burn resistances of the fuses under a given process variation is used to provide the lower and upper limits within which the programming is performed. The lower and upper limits correspond to the lower and upper temperatures that may result due to the heating of the fuses when a program current passes through the fuses.

A fuse, once programmed successfully, is not damaged if it is programmed again. This characteristic is utilized in the multi-segment programming scheme. A program circuit includes a number of program devices (e.g., transistors) that provide program voltage or current to the fuses. A control circuit controls the program circuit to generate the program voltages or currents with gradually increasing magnitudes. At start, the control circuit activates the program device to generate the lowest program voltage or current that is sufficient to program the fuses with the lowest pre-burn resistance. Then, the control circuit activates the next program device or devices to generate the next higher programming voltage or current that is sufficient to program the fuses with the next pre-burn resistance. The process may be repeated as many times as necessary until the highest programming voltage or current is reached which may correspond to fuses with the highest pre-burn resistance.

In an alternative embodiment, the program circuit may include only a single set of program devices. The control circuit may activate the program device several times, each time with a gradually increasing fuse program voltage. The program device thus generates gradually increasing program voltages or currents. The objective is to provide program voltages or currents that cover the entire range of the pre-burn resistances of the fuses.

Figure 1:
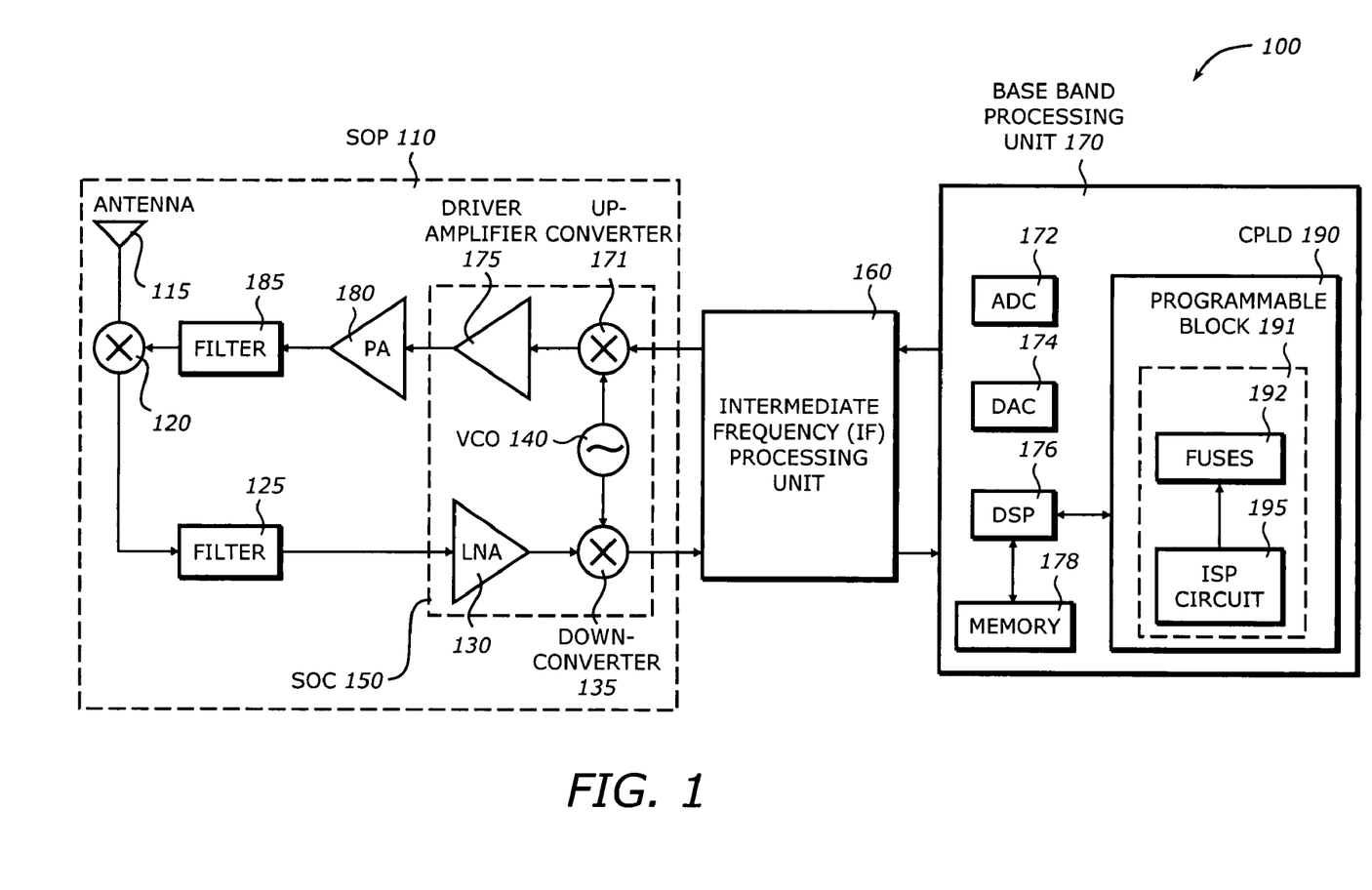
FIG. 1 is a diagram illustrating a system in which one embodiment of the invention can be practiced.

FIG. 1 is a diagram illustrating a system 100 in which one embodiment of the invention may be practiced. The system 100 represents a mobile communication module. It includes a system on package (SOP) 110, an intermediate frequency (IF) processing unit 160, and a base-band processing unit 170.

The SOP 110 represents the front end processing unit for the mobile communication module. It is a transceiver incorporating on-package integrated lumped passive components as well as radio frequency (RF) components. It includes an antenna 115, a duplexer 120, a filter 125, a system-on-chip (SOC) 150, a power amplifier (PA) 180, and a filter 18.

The antenna 115 receives and transmits RF signals. The RF signals may be converted to digital data for processing in subsequent stages. It is designed in compact micro-strip and strip-line for L and C-band wireless applications. The duplexer 120 acts as a switch to couple to the antenna 115 to the receiver and the transmitter to the antenna 115. The filters 125 and 185 are C-band LTCC-strip-line or multilayer organic lumped-element filter at 5.2 GHz and narrowband performance of 200 MHz suitable for the Institute of Electrical and Electronic Engineers (IEEE) 802.11 wireless local area network (WLAN). The SOC 150 includes a low noise amplifier (LNA) 130, a down converter 135, a local voltage controlled oscillator (VCO) 140, an up converter 170, and a driver amplifier 175. The LNA 130 amplifies the received signal. The down converter 135 is a mixer to convert the RF signal to the IF band to be processed by the IF processing unit 160. The up converter 170 is a mixer to convert the IF signal to the proper RF signal for transmission. The VCO 140 generates modulation signal at appropriate frequencies for down conversion and up conversion. The driver amplifier 175 drives the PA 180. The PA 180 amplifies the transmit signal for transmission.

The IF processing unit 160 includes analog components to process IF signals for receiving and transmission. It may include a band-pass filter and a low pass filter at suitable frequency bands. The filter may provide base-band signal to the base-band processing unit 170.

The base-band processing unit 170 may include an analog-to-digital converter (ADC) 172, a digital-to-analog converter (DAC) 174, a digital signal processor (DSP) 176, a memory 178, and a complex programmable logic device (CPLD) 190. The ADC 172 and the DAC 174 are used to convert analog signals to digital data and digital data to analog signal, respectively. The DSP 176 is a programmable processor that may execute a program to process the digital data. The DSP 176 may be coupled to the front end processing unit via the IF processing unit 160 and/or the base-band processing unit 170 to process the digital data.

The memory 178 may stores program code and data for the DSP 176. The memory 178 is typically implemented with dynamic random access memory (DRAM), static random access memory (SRAM), or any other types of memories including those that do not need to be refreshed. The memory 178 may include multiple channels of memory devices such as DRAMs. The DRAMs may be Synchronous DRAM (SDRAM), Single Data Rate (SDR) SDRAM, Extended Data Out (EDO) DRAM, Double Data Rate (DDR) SDRAM, Double Data Rate Two (DDR2) SDRAM, Rambus DRAM (RDRAM R), Extreme Data Rate (XDR), or XDR II. RDRAM and XDR are registered trademarks of Rambus. The DDR doubles transfer rates by transferring data on both the rising and falling edges of the clock and may be packaged in a Dual In Line Memory Module (DIMM). This effectively doubles the transfer rate without increasing the frequency of the front side bus (FSB). The DDR2 increases the data rates using various techniques such as on-die termination to eliminate excess signal noise on the chip, pre-fetch buffers, and off-chip drivers. The off-chip drivers may use calibration techniques to calibrate the differential data strobes against each other. Through the calibration, the ramping voltages are optimized for the buffer impedances to reduce over- and under-shooting at the rising and falling edges. The XDR or XDR II uses Differential Rambus Signaling Levels (DRSL) for scalable high speed point-to-point bidirectional data signals and Rambus Signaling Level (RSL) for source synchronous bussed address and command signals to multiple deices. The memory devices used in the memory 178 may operate at any suitable clock frequency, such as 100 MHz, 133 MHz, 166 MHz, 266 MHz, 333 MHz, 400 Mhz, 1 GHz, or scalable to 8 GHz. They may be packaged in any packaging technologies including Ball Grid Array (BGA), DIMM, sticks or modules.

The CPLD 190 may perform complex logic functions to support the DSP 176. It may include programmable macro cells and usable gates. It may include a programmable block 191 and other components. The programmable block 191 may include a number of electronic fuses 192 and a multi-phase or multi-segment in-system programming (ISP) circuit 195. The fuses 192 are used to program or configure the macro cells or interconnection patterns for the logic gates. They may form a switch matrix to connect to a programmable array, product terms, or macro cells. The ISP circuit 195 provides in-circuit or in-system programming for the fuses 192. The programming may be performed at manufacturing facilities or in the field. The ISP circuit 195 provides a novel programming technique to reduce the under-programming or over-programming problems that may be caused by prior art techniques.

Figure 2:
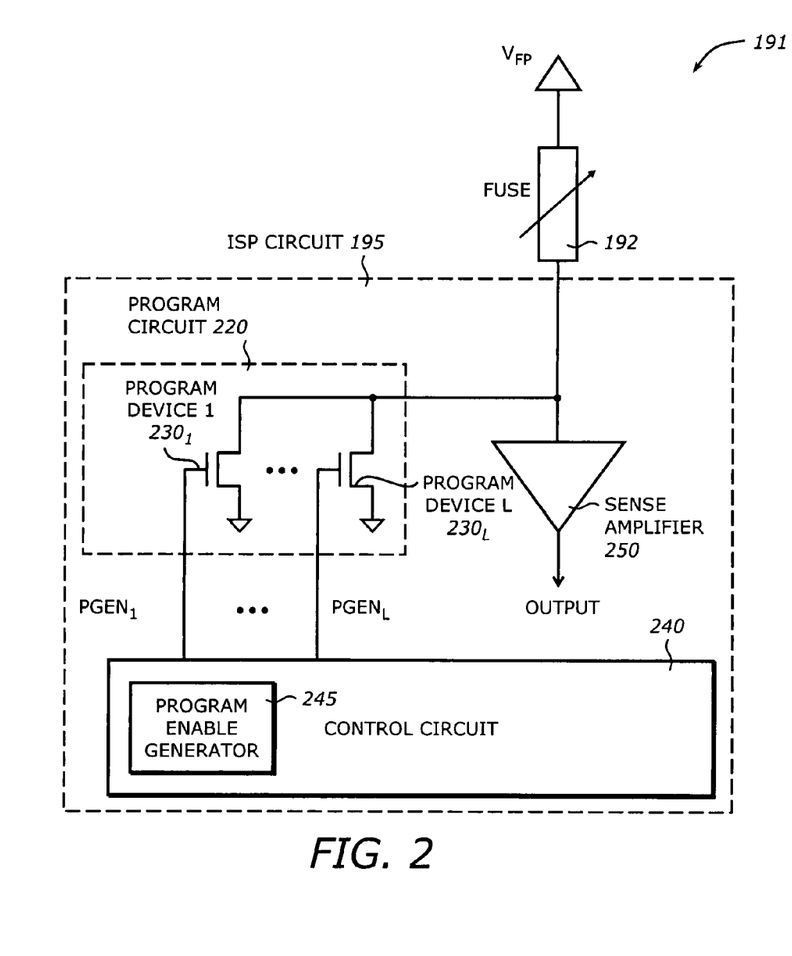
FIG. 2 is a diagram illustrating a programmable block using multiple program devices according to one embodiment of the invention.

FIG. 2 is a diagram illustrating the programmable block 191 using multiple program devices according to one embodiment of the invention. The block 191 includes a fuse 192 and the ISP circuit 195. The circuit 195 includes a program circuit 220, a control circuit 240, and a sense amplifier 250. The circuit 195 is connected to one end of the fuse 192. The block 191 may include more than one fuse and/or more than one program circuit.

The fuse 192 may be any suitable electronic fuse. They may be metal, such as copper, or any other material suitable for fuse fabrication. They may be used in programmable interconnections in microprocessors, CPLDs, Application Specific Integrated Circuits (ASICs). Programming the fuses involve applying a program voltage or a program current to pass through the fuses. This changes the fuse material from a low resistance to a high resistance. One end of the fuse 192 is connected to a fuse program voltage $V_{FP}$. The fuse program voltage $V_{FP}$ may come from any suitable source such as a controllable program voltage generator or the circuit power supply. During the programming procedure, the fuse program voltage $V_{FP}$ is kept fixed or constant.

The program circuit 220 is connected to the fuse 192. The program circuit 220 is responsible for programming the one or more fuses that are connected to it by generating appropriate program current under control by the control circuit 240. The program circuit 220 includes one or more program devices. For example, the program circuit 220 includes L program devices $230_1$ to $230_L$ to program the fuse 192. The program device $230_i$ (i=1, . . . , L) may be any appropriate device or circuit that can generate an appropriate amount of program current (e.g., 15 mA) through the fuse. In one embodiment, the program device $230_i$ may be implemented as a transistor, such as an n-channel Metal Oxide Semiconductor (NMOS), p-channel MOS (PMOS), or a few of such transistors arranged in series or in parallel. They may also be a special high voltage tolerant transistor, such as vertical drain NMOS (VDNMOS), or vertical drain and source NMOS (VSDNMOS). As an illustrative example, the program devices $230_1$ to $230_L$ are NMOS transistors. As is known by one skilled in the art, other program devices such as PMOS transistors or transistor circuits, may be employed. The program devices $230_i$ may be designed or configured to be able to generate a desired program current. Typically, the program currents generated by the program devices $230_1$ to $230_L$ are gradually increasing to cover the region from the lower limit to the upper limit of the program region. For example, the program device $230_1$ may be configured or designed to provide the lowest program current and the program device $230_L$ may be configured or designed to provide the highest program current.

The control circuit 240 controls the generation of the program voltages or currents to the fuse 192 in succession. It may include a program enable generator 245. The program enable generator 245 generates program enable signals (e.g., $PGEN_i$) to the program circuit 220. The program enable signals, when asserted, activate the corresponding program devices to generate the program voltages or currents. When the program devices are transistors the program enable signals may be connected to the gates of the transistors to turn on or turn off them accordingly.

The sense amplifier 250 provides an output signal based on the sensed signal from the fuse 192. The sense amplifier 250 may be used to measure the post-burn resistance of the fuses 192 to determine if the programming is successful. A fuse programming is successful when it changes the fuse resistance from a low value to a very high value (e.g., 50 KΩ) to operate as an open circuit. The sense amplifier 250 may be single ended or double ended.

To provide gradually increasing program voltages or currents, the control circuit 240 first asserts a program enable control signal to a program device designed to generate the lowest current that is sufficient to program the fuse having the lowest pre-burn resistance. This may be performed by applying a programming pulse to activate the program device. The program pulse has a pulse width that is sufficiently long to affect the programming. Typically, the pulse width may be less than a few milliseconds. For example, to program the fuse 192, the program enable generator 245 in the control circuit 240 may first assert the $PGEN_1$ control signal to turn on the transistor $230_1$. At the same time, it de-asserts the rest of the program enable control signals PGENj (j=2, ..., L) to turn off the remaining transistors in the program circuit 220. Then, the program enable generator 245 asserts the next program enable control signal (e.g., $PGEN_2$) to turn on the next transistor $230_2$ while de-asserting the rest of the program enable control signals to turn off the corresponding transistors. The next transistor $230_2$ is configured to generate a program voltage/current higher than that of the transistor $230_1$. Alternatively, any number of transistors $230_i$'s may be turned on simultaneously and/or selectively in a pre-defined sequence to correspond to the desired program current sequence. The process is repeated until the last program enable control signal $PGEN_L$ is generated. In this way, the fuse 192 is eventually programmed with a right amount of program current. As discussed earlier, programming a successfully programmed fuse, even with a higher current, does not cause collateral damage to the fuse or the neighboring circuits. Therefore, incremental programming with gradually increasing program voltage or current may ensure that the fuse is programmed with the right amount of program voltage or current.

Figure 3:
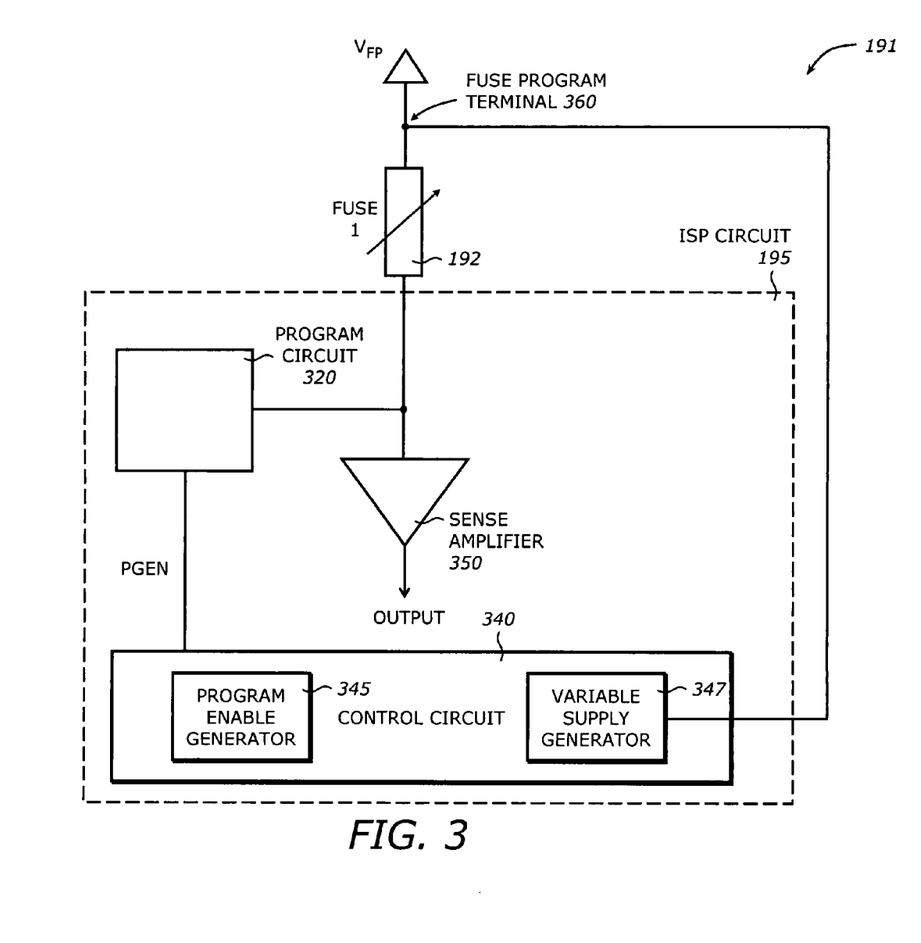
FIG. 3 is a diagram illustrating a programmable block using variable fuse program voltage a according to one embodiment of the invention.

FIG. 3 is a diagram illustrating the programmable block 191 using variable fuse program voltage according to one embodiment of the invention. The block 191 includes the fuse 192 and the ISP circuit 195. The circuit 195 includes a program circuit 320, a control circuit 340, and a sense amplifier 350. The circuit 195 is connected to the fuse 192 and the fuse program voltage $V_{FP}$.

The fuse 192 and the sense amplifier 350 shown in FIG. 3 are similar to the fuse 192 and the sense amplifier 250 shown in FIG. 2. One end of the fuse 192 is connected to the fuse program voltage $V_{FP}$ at a fuse voltage terminal 360.

The program circuit 320 is connected to the fuse 192. The program circuit 320 may be connected to one or more fuses 192. The program circuit 320 may contain one or more program devices. The program circuit 320 may include a transistor or more than one transistor arranged in series or parallel. The program circuit 320 is similar to the program circuits 220 in FIG. 2 except that instead of having multiple program control signals, the program circuits 320 may have only one program control signal.

The control circuit 340 includes a program enable generator 345 and a variable supply generator 347. The program enable generator 345 generates a program enable control signal PGEN to control or activate the program circuit 320. The variable supply generator 347 provides a variable fuse program voltage at the fuse program voltage terminal 360. The variable fuse program voltage may be at several program voltage levels. The program voltage levels are selected to correspond with the program limits corresponding to the range of the pre-burn resistances of a fuse. Each time a program device is activated to program the fuse, the variable supply generator provides a corresponding fuse program voltage level. The fuse program voltage levels are gradually increasing voltage levels so that for the same program device, by increasing the fuse program voltage $V_{FP}$ at the selected fuse program voltage levels, a sequence of gradually increasing program voltages or currents may be obtained to achieve the same result as using multiple program devices with a constant or fixed fuse program voltage $V_{FP}$.

For example, to program the fuse 192 which is connected to the program circuit 320, the variable supply generator 347 generates the fuse program voltage $V_{FP}$ at the lowest fuse program voltage level. This results in a lowest program voltage or current through the fuse. Then, the program enable generator 345 asserts the PGEN signal to turn on a transistor in the program circuit 320 at a first time. This may be achieved by applying a programming pulse PGEN to the gate of the NMOS transistor. The programming pulse PGEN has a pulse width sufficiently long to affect the programming. Next, the variable supply generator 347 generates the fuse program voltage $V_{FP}$ at the next higher fuse program voltage level. This results in a higher program voltage or current through the fuse. Then, the program enable generator 345 again asserts the PGEN signal to turn on the NMOS transistor in the program circuit 320 at a second time. The process may be repeated until all the fuse program voltage levels have been generated. In this manner, the fuse 192 will be eventually programmed with the right amount of program voltage or current.

Figure 4:
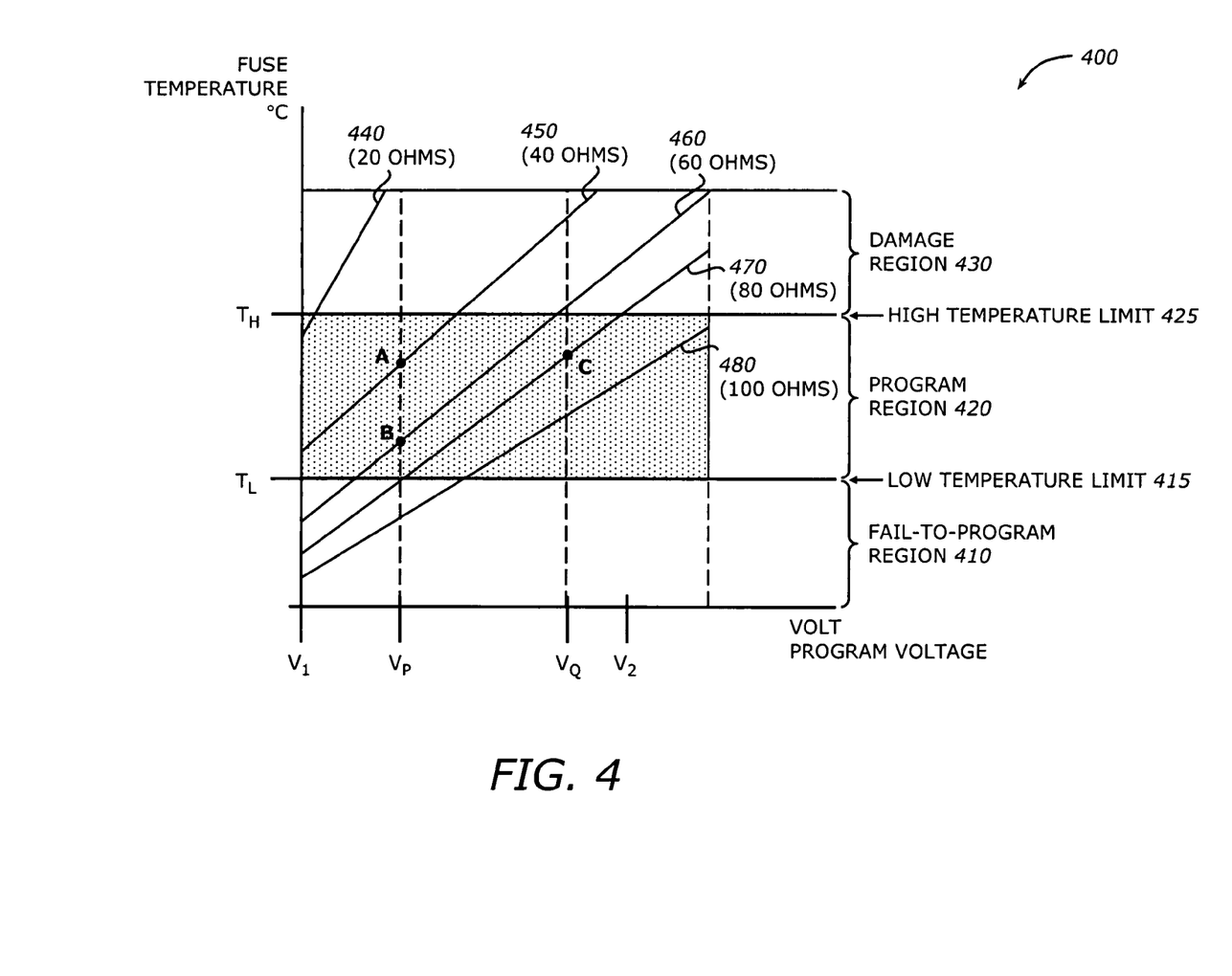
FIG. 4 is a diagram illustrating operating regions for a given process variation according to one embodiment of the invention.

FIG. 4 is a diagram illustrating the operating regions 400 for a given process variation according to one embodiment of the invention. In this illustrative example, the process variation provides fuses having pre-burn resistances ranging from 20Ω to 100Ω. Due to the random variations, it is not known in advance the exact values of the pre-burn resistances of the fuses.

Suppose that a fuse may be successfully programmed if its temperature, as a result of a programming current passing through, is within a low limit of $T_L$ to a high limit of $T_H$. In other words, a temperature above $T_H$ may melt the fuse element causing damage to the fuse and collateral damage to other circuits. A temperature below $T_L$ is insufficient to get a void formed within a reasonable time (e.g., 1 millisecond) for fuse programming.

The operating regions 400 therefore include three regions: a fail-to-program region 410, a program region 420, and a damage region 430. The fail-to-program region 410 is the region where the fuses are under-programmed or not successfully programmed. It is limited at the high end by a low temperature limit $T_L$ 415. The low temperature limit $T_L$ 415 is the limit below which the fuse is not fully programmed. The program region 420 is the region where the fuses are successfully programmed. It is a safe region and is limited by the low temperature limit $T_L$ 415 and a high temperature limit $T_H$ 425. The high temperature limit $T_H$ 425 is the limit above which the fuse may be damaged (e.g., melted) and collateral damage may occur. The damage region 430 is the region where the fuses are over-programmed or collateral damage may occur. It is limited at the low end by the high temperature limit $T_H$ 425. It is desirable to program all the fuses within the program region 420.

The range of the pre-burn resistance values may be divided into several sub-ranges delimited by the resistance values of 20Ω, 40Ω, 60Ω, 80Ω, and 100Ω. The sub-ranges are selected such that each sub-range covers a safe programming region for a fuse having a pre-burn resistance within that sub-range.

For each resistance value, a characteristic may be obtained. This characteristic may be represented by a predictable relationship between the program voltage and the fuse temperature at the end of the programming pulse (e.g., 1 millisecond). As is known by one skilled in the art, a non-linear relationship may be obtained. However, the significance of each characteristic may be at the two ends of the characteristic corresponding to the two limits of the temperature. The characteristics may be obtained by experiment, calibration, modeling, or any combination of these.

In the illustrative example shown in FIG. 4, the characteristics 440, 450, 460, 470, and 480 are obtained for the pre-burn resistance values of 20Ω, 40Ω, 60Ω, 80Ω, and 100Ω, respectively. These characteristics show that all the fuses have the pre-burn values ranging from 20Ω, 40Ω, 60Ω, 80Ω, and 100Ω may be successfully programmed using program voltages from $V_1$ to $V_2$. Typically, the process variations result in pre-burn resistance values with a variation of approximately 40Ω. For example, the pre-burn resistance values may range from 20Ω to 60Ω, 40Ω to 80Ω, or 60Ω to 100Ω. Under these ranges, it may be necessary to provide two programming pulses to successfully program all fuses. For a larger variation, it may be necessary to provide three or four programming pulses.

As an example, suppose the process variation result in pre-burn resistance values ranging from 40Ω to 80Ω. For these fuses, two programming pulses at $V_P$ and $V_Q$ ($V_Q > V_P$) are sufficient. The programming pulse $V_P$ 1.25V is applied first. At this programming pulse, the fuses having the pre-burn resistance value of 40Ω represented by the characteristic 450 are successfully programmed because the fuse temperature is at point A, which is below $T_H$ and is in the program region 420. Similarly, the fuses having the pre-burn resistance value of 60Ω represented by the characteristic 460 are also successfully programmed because the temperature is at point B and is in the program region 420. Fuses having the pre-burn resistance values between 40Ω and 60Ω are also successfully programmed by the $V_P$ program pulse because their resulting temperatures are between A and B, within the program region 420. Similarly, fuses having the pre-burn resistance values between 60Ω and 80Ω are also successfully programmed by the $V_P$ program pulse because their resulting temperatures are between B and $T_L$, within the program region 420.

After the programming pulse $V_P$ is applied, the programming pulse $V_Q$ is applied. At this programming pulse, the fuses having the pre-burn resistance value of 80Ω represented by the characteristic 470 are successfully programmed because the fuse temperature is at point C and is in the program region 420. Note that fuses that have already been programmed by the $V_P$ are not affected by the $V_Q$ programming pulse. The result is that all fuses are successfully programmed by two programming pulses at $V_P$ and $V_Q$. There is no under-programming or over-programming. In addition, there is no collateral damage.

Figure 5:
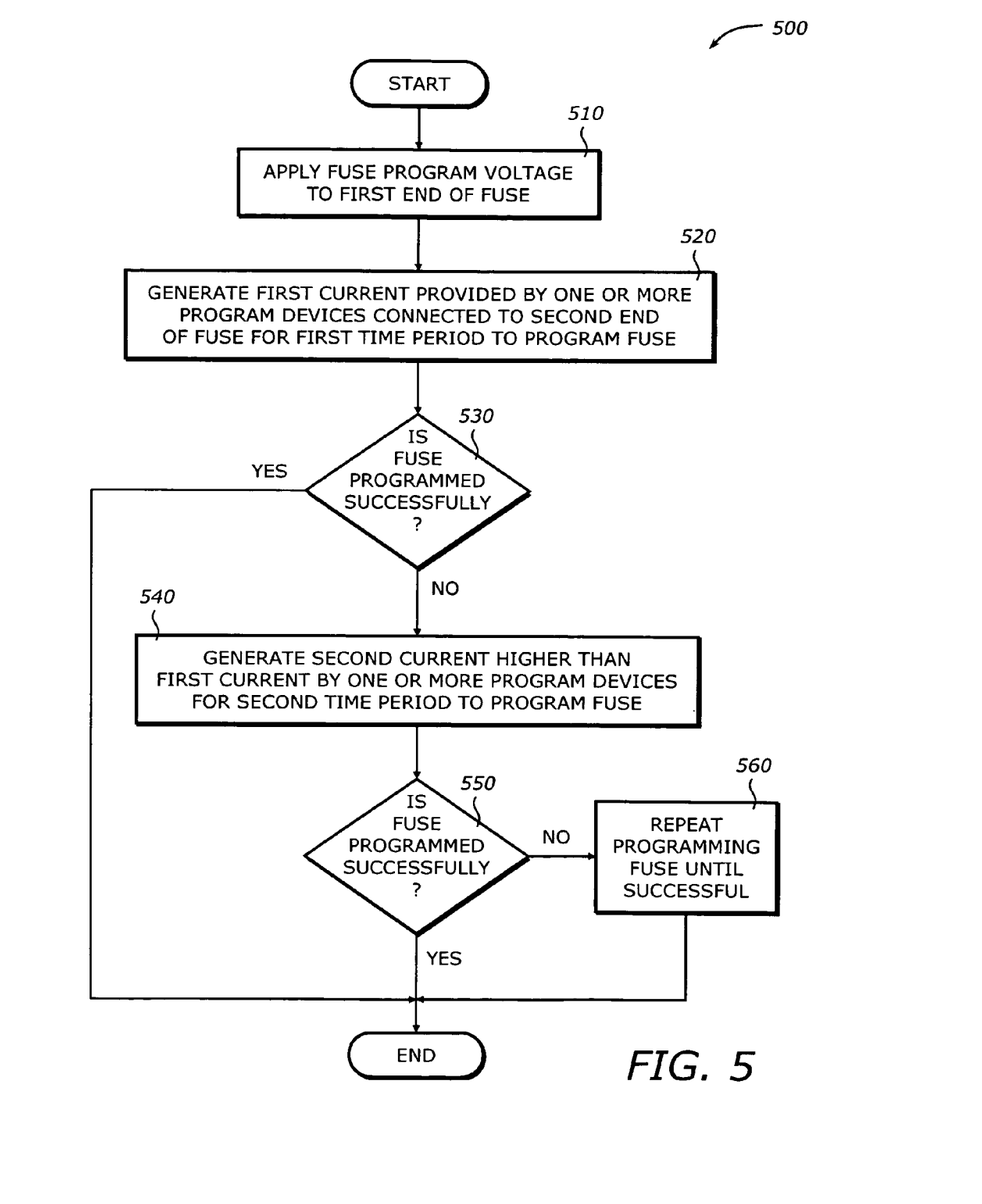
FIG. 5 is a flowchart illustrating a process to program a fuse using fixed fuse program voltage according to one embodiment of the invention.

FIG. 5 is a flowchart illustrating a process 500 to program a fuse using fixed fuse program voltage according to one embodiment of the invention. The process 500 corresponds to the circuit shown in FIG. 2.

Upon START, the process 500 applies a fuse program voltage to a first end of a fuse (Block 510). In one embodiment, this fuse program voltage remains fixed through out the programming process. The fuse program voltage may come from a number of sources, including a program voltage circuit, the circuit power supply, or any other suitable voltage sources.

Next, the process 500 generates a first current provided by one or more program devices connected to a second end of the fuse for a first time period to program the fuse (Block 520). The one or more program devices may be connected in series or in parallel. They may be transistors or any other controllable current generating devices. This operation may be performed by generating a first program enable signal to turn on the one or more program devices.

Then, the process 500 determines if the first current successfully programs the fuse or if the fuse has been programmed successfully (Block 530). This operation may be optional and may be performed before Block 540. This operation may be performed by receiving the output of the sense amplifier which indicates the resistance of the fuse. If the fuse resistance exceeds a pre-defined threshold, then the fuse is successfully programmed.

If the fuse is successfully programmed, the process 500 is terminated. Otherwise, the process 500 generates a second current higher than the first current by the one or more program devices for a second time period to program the fuse (Block 540). The second time period may be the same or different than the first time period. This may be performed by generating a second program enable signal to turn on the one or more program devices. This second set of program devices may be the same or different than the first set of program devices.

Next, the process 500 determines if the second current successfully programs the fuse after generating the second current (Block 550). This operation may be optional. If the fuse is successfully programmed, the process 500 is terminated. Otherwise, the process 500 repeats programming the fuse until successful (Block 560) and is then terminated. Repeating programming the fuse may include generating a next current higher than the previous one.

Figure 6:
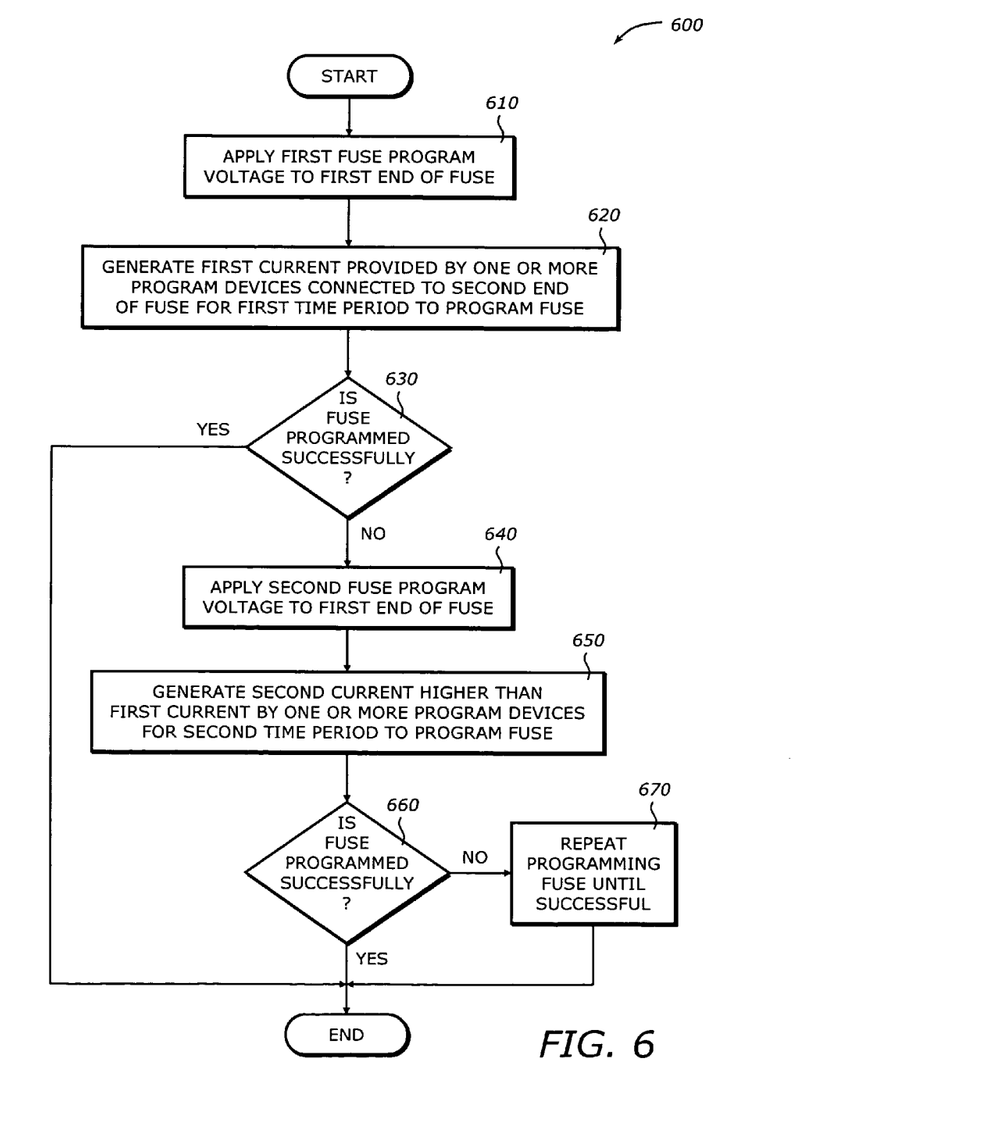
FIG. 6 is a flowchart illustrating a process to program a fuse using variable fuse program voltage according to one embodiment of the invention.

FIG. 6 is a flowchart illustrating a process 600 to program a fuse using variable fuse program voltage according to one embodiment of the invention. The process 500 corresponds to the circuit shown in FIG. 3.

Upon START, the process 600 applies a first fuse program voltage to a first end of a fuse (Block 610). The first fuse program voltage may come from a variable supply generator. Next, the process 600 generates a first current provided by one or more program devices connected to a second end of the fuse for a first time period to program the fuse (Block 620). This may be performed by generating a first program enable signal to turn on the one or more program devices.

Then, the process 600 determines if the first current successfully programs the fuse before applying the second fuse program voltage (Block 630). This operation may be optional and may be performed by determining the fuse resistance as provided by an output of a sense amplifier. If the fuse is successfully programmed, the process 600 is terminated. Otherwise, the process 600 applies a second fuse program voltage to the first end of the fuse (Block 640). In one embodiment, the second fuse program voltage is higher than the first program voltage. The second fuse program voltage may come from the variable supply generator.

Next, the process 600 generates a second current higher than the first current by the one or more program devices for a second time period to program the fuse (Block 650). This may be performed by generating a second program enable signal to turn on the one or more program devices. In one embodiment, the first and second program enable signals are the same so that the same program device or devices may be turned on. These program devices have been sized according to the first and second fuse program voltages to correspond to the first and second currents.

Then, the process 600 determines if the second current successfully programs the fuse after generating the second current (Block 660). This operation is optional and may be performed by determining the fuse resistance as provided by the output of the sense amplifier. If the fuse is successfully programmed, the process 600 is terminated. Otherwise, the process 600 repeats programming the fuse until successful (Block 670) and is then terminated. Repeating programming the fuse may include generating a next fuse program voltage higher than the previous one and turning on the one or more program devices.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
    a program circuit coupled to a fuse to generate first and second currents to program the fuse, the second current is higher than the first current; and
    a control circuit coupled to the program circuit to control generating the first and second currents in succession.

2. The apparatus of claim 1 wherein the program circuit comprises:
    one or more devices to generate the first and second currents.

3. An apparatus comprising:
    a program circuit coupled to a fuse to generate first and second currents to program the fuse, the second current is higher than the first current, the program circuit comprising one or more devices to generate the first and second currents; and
    a control circuit coupled to the program circuit to control generating the first and second currents in succession;
    wherein the control circuit comprises:
    a program enable generator coupled to the one or more devices to assert a program enable signal to the one or more devices a first time to generate the first current and a second time after the first time to generate the second current; and
    a variable supply generator coupled to a fuse program terminal of the fuse to generate first and second fuse program voltages at first and second times, respectively, the second fuse program voltage being higher than the first fuse program voltage.

4. The apparatus of claim 3 wherein the program circuit comprises:
    a first device to generate the first current; and
    a second device to generate the second current.

5. The apparatus of claim 4 wherein the control circuit comprises:
    a program enable generator coupled to the first and second devices to assert a first program enable signal to the first device before asserting a second program enable signal to the second device.

6. The apparatus of claim 3 wherein at least one of the first and second currents causes the fuse to be at a temperature within a program region.

7. A system comprising:
    a front end processing unit to receive and transmit a radio frequency (RF) signal, the RF signal being converted to digital data;
    a digital signal processor (DSP) coupled to the front end processing unit to process the digital data; and
    a programmable logic device coupled to the DSP to perform logic functions, the DSP having a plurality of fuses and an in system programming (ISP) circuit, the ISP circuit comprising:
    a program circuit coupled to a fuse to generate first and second currents to program the fuse, the second current is higher than the first current, and
    a control circuit coupled to the program circuit to control generating the first and second currents in succession.

8. The system of claim 7 wherein the program circuit comprises:
    a first device to generate the first current; and
    a second device to generate the second current.

9. The system of claim 8 wherein the control circuit comprises:
    a program enable generator coupled to the first and second devices to assert a first program enable signal to the first device before asserting a second program enable signal to the second device.

10. The system of claim 7 wherein the program circuit comprises:
    one or more devices to generate the first and second currents.

11. The system of claim 10 wherein the control circuit comprises:
    a program enable generator coupled to the one or more devices to assert a program enable signal to the one or more devices a first time to generate the first current and a second time after the first time to generate the second current; and
    a variable supply generator coupled to a fuse program terminal of the fuse to generate first and second fuse program voltages at first and second times, respectively, the second fuse program voltage being higher than the first fuse program voltage.

12. The system of claim 7 wherein at least one of the first and second currents causes the fuse to be at a temperature within a program region.

* * * * *